United States Patent [19]

Schwarz et al.

[11] Patent Number: 4,726,392
[45] Date of Patent: Feb. 23, 1988

[54] DRAINAGE CANAL

[75] Inventors: Gerhard Schwarz, Allemühl; Herbert Eckhard, Eberbach, both of Fed. Rep. of Germany

[73] Assignee: Brown, Boveri & Cie AG, Mannheim, Fed. Rep. of Germany

[21] Appl. No.: 852,528

[22] Filed: Apr. 16, 1986

[30] Foreign Application Priority Data

Apr. 16, 1985 [DE] Fed. Rep. of Germany ....... 3513537

[51] Int. Cl.⁴ .............................................. F04F 10/00
[52] U.S. Cl. .......................... 137/247.21; 137/247.45
[58] Field of Search .................. 137/247.15, 247.21, 137/247.41, 247.45, 247.47, 247.49, 247.51

[56] References Cited

U.S. PATENT DOCUMENTS

| Re. 8,281 | 6/1878 | Turner | 137/247.21 |
| 179,881 | 7/1876 | Underwood | 137/247.21 |
| 259,256 | 6/1882 | Withey | 137/247.51 X |
| 1,884,855 | 10/1932 | Pryce | 137/247.51 |
| 4,502,500 | 3/1985 | Upton | 137/247.41 X |

FOREIGN PATENT DOCUMENTS 794287 1/1981 U.S.S.R. ............ 137/247.15

Primary Examiner—Gerald A. Michalsky
Attorney, Agent, or Firm—Herbert L. Lerner; Laurence A. Greenberg

[57] ABSTRACT

A drainage canal assembly includes a canal housing for receiving electrical components, a drainage canal in the form of a syphon formed in the canal housing, and a check valve disposed in the drainage canal permitting liquid to leave the canal housing but preventing liquid and dust from entering.

8 Claims, 5 Drawing Figures

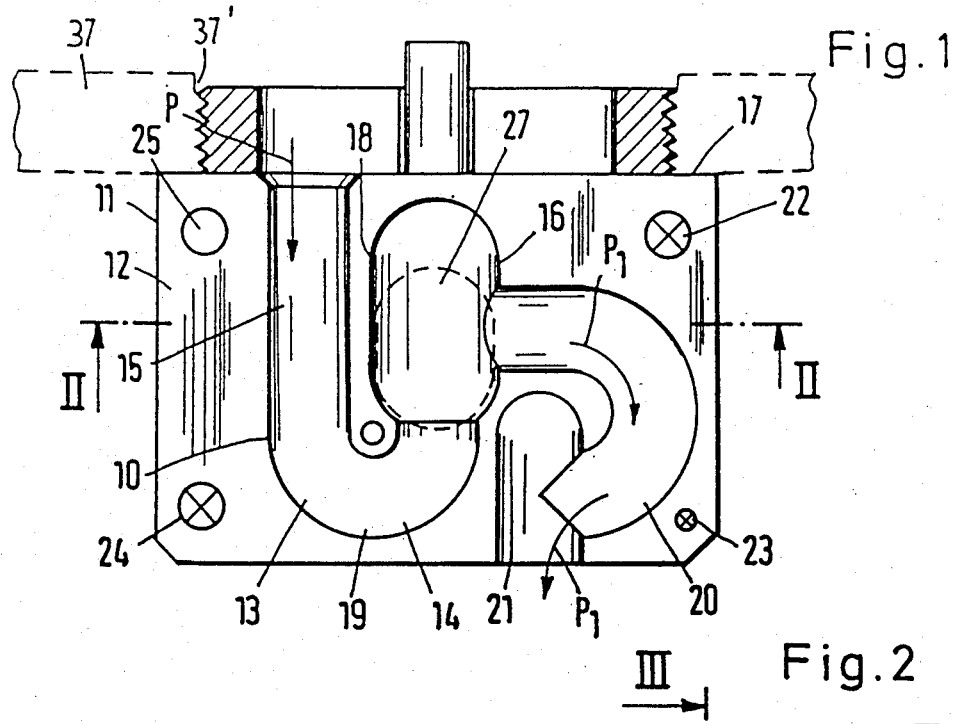
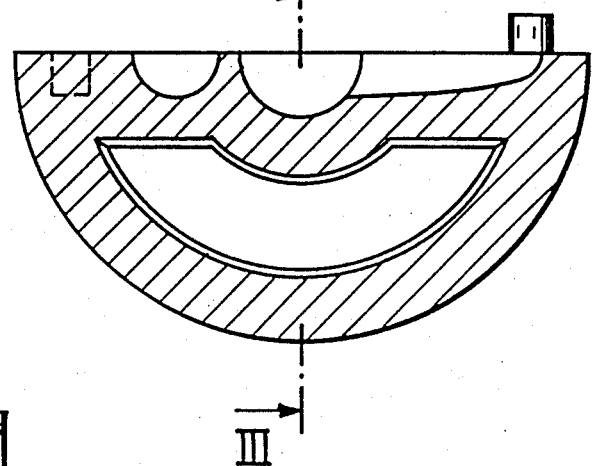
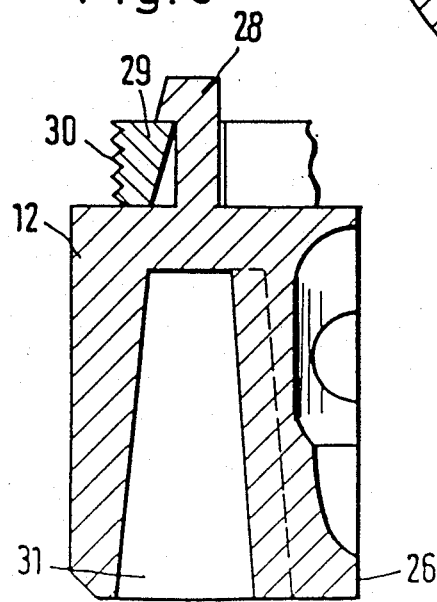

DRAINAGE CANAL

The invention relates to a drainage canal formed in a housing containing electrical components for complying with IP 54 and IP 65. In housings for accomodating electrical components, a frequent problem is that water of condensation forms within the housing, which must be discharged to the outside. In some such housings, venting connections are formed which provide for an air stream in the interior of the housing; this, however, has the disadvantage of permitting dust to penetrate into the interior of the housing. It has become known to insert porous sintered material into venting nozzles, which serves for sealing against dust and through which the water of condensation can flow off, if necessary.

It is accordingly an object of the invention to provide a drainage canal which overcomes the hereinafore-mentioned disadvantages of the heretofore-known devices of this general type, in which an optimum discharge of the water of condensation is achieved, in which dust tightness is also obtained and more specifically for the Protection Classes IP 54 and IP 65.

With the foregoing and other objects in view there is provided, in accordance with the invention, a drainage canel assembly, comprising a canal housing for receiving electrical components complying with IP 54 and IP 65 requirements, a drainage canal in the form of a syphon formed in the canal housing, and a check valve disposed in the drainage canal permitting liquid to leave the canal housing but preventing liquid and dust from entering or penetrating.

Such a drainage canal allows the water of condensation to leave and dust and the like cannot get into the interior of the housing due to the syphon-like shape with the check valve.

In accordance with another feature of the invention, there are provided means for fastening the canal housing to a discharge opening in an adjacent housing to be drained.

In accordance with a further feature of the invention, the drainage canal includes a U-shaped canal section having a first leg opening into the discharge opening, a bend forming the lowest point of the drainage canal, and a second leg having a larger diameter than the first leg and the bend, the check valve including a ball or sphere disposed in the second leg for floating on liquid.

In accordance with an added feature of the invention, the first leg opens into the discharge opening in a given direction, and the canal housing has a bottom, and including a discharge canal being open toward the bottom of the canal housing in the direction opposite the given direction, the discharge canal being parallel to the first leg and leading into the second leg. This is also done so that the water can flow off.

In accordance with an additional feature of the invention, the canal housing is formed of interconnected, mirror-symmetrical housing halves having contact surfaces facing each other, the contact surfaces each having a respective depression formed therein with the shape of the drainage canal supplementing each other when the housing halves are interconnected to form the drainage canal.

In accordance with again another feature of the invention, the contact surfaces have depressions formed therein and posts formed thereon being aligned and interconnected forming a clamping fit.

In accordance with again a further feature of the invention, the canal housing is formed of interconnected, mirror-symmetrical housing halves, the canal housing has a surface adjacent the discharge opening in the housing to be drained, and including a snap hook formed on the surface on each housing half locking or detenting the housing halves together.

In accordance with again an added feature of the invention, the fastening means include a threaded ring to be screwed to the housing to be drained, surrounding and being locked or detented to the snap hooks.

In accordance with again an additional feature of the invention, the canal housing is formed of first and second interconnected housing parts and has a first surface facing toward and a second surface facing away from a discharge opening in a housing to be drained, and the drainage canal includes first and second mutually spaced apart through holes formed in the first housing part, the first through hole having an opening for communication with the discharge opening, the second through hole being closed toward the housing to be drained, the check valve being disposed in the second through hole, a discharge canal being formed in the first housing part, being connected to the second through hole and being open toward the second surface, and a connecting canal formed in the second housing part and interconnecting the two through holes at ends thereof facing toward the second surface forming a U-shaped bend of the drainage canal.

In accordance with yet another feature of the invention, the second housing part includes a canal ring liquid-tightly separated from the connecting canal and communicating with the discharge canal, and the second housing part includes drainage holes leading from the canal ring to the surroundings.

In accordance with yet a further feature of the invention, the first housing part includes a transverse hole connecting the discharge canal to the second through hole, and the second housing part includes a collar covering the transverse hole.

In accordance with yet an added feature of the invention, the housing parts are cylindrical and are screwed together.

In accordance with yet an additional feature of the invention, the connecting canal is a circular depression and the canal ring is a circular ring concentrically surrounding the circular depression.

In accordance with a concomitant feature of the invention, the check valve includes a hollow sphere assembled from two hollow hemispheres.

Other features which are considered as characteristic for the invention are set forth in the appended claims.

Although the invention is illustrated and described herein as embodied in a drainage canal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a diagrammatic elevational view of a housing part according to a first embodiment of the invention;

FIG. 2 is a cross-sectional view taken along the section line II—II of FIG. 1, in the direction of the arrows;

FIG. 3 is a cross-sectional view taken along the section line III—III of FIG. 2, in the direction of the arrows;

Figure 4:
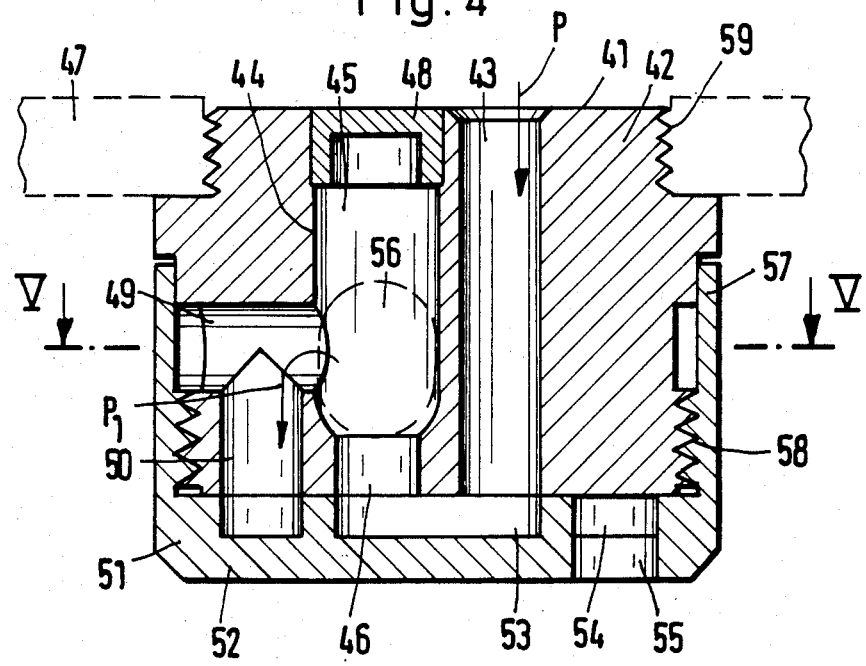
FIG. 4 is a cross-sectional view of another embodiment of the invention taken along the section line IV—IV of FIG. 5, in the direction of the arrows.

Referring now to the figures of the drawings in detail and first, particularly, to FIG. 1 thereof, there is seen a drainage canal 10 formed in a canal housing 11; only a part 12 of the housing is shown in FIG. 1. The direction of view in FIG. 1 is onto a lateral parting surface in which a depression 13 with a semicircular cross section is formed. The depression has a first U-shaped section 14, a first leg 15 of which points toward an outlet opening 37' in another housing 37 to be drained and is aligned with the opening. The U-shaped section 14 also has a second leg 16 which is closed toward a surface 17 of the canal housing and which has an enlargement 18, the purpose of which will be discussed below. A bend 19 in the U-shaped section 14 is the lowest point when mounted to the other housing to be drained.

An outlet canal 20 extends transversely to the second leg 16, i.e. transversely to the enlargement 18. The outlet or discharge canal 20 is curved in a U-shape and opens into a blind hole 21 which is open toward the surface of the canal housing opposite the surface 17. Disposed on the surface which is visible in FIG. 1 and represents the parting surface of the canal housing 11, are posts 22, 23 and 24 as well as a hole 25 which cooperates with posts and holes formed in the other half of the canal housing with mirror-symmetry, so that a connection of the two housing halves is brought about by a press fit. The housing half 12 of FIG. 3 is thereby supplemented by a non-illustrated housing half with mirror-symmetry which is assembled to a contact surface 26, so that the depressions 13 are supplemented to form the drainage canal 10. The interior of the enlargement 18 contains a hollow sphere 27 which is freely movable in the enlargement 18.

Formed on the surface 17 of the housing 11 are snap hooks 28 which can reach behind a fastening ring 29 or are surrounded by the fastening ring. The outer rim of the fastening ring 29 has an external thread 30, through which the canal housing 11 can be fastened to the discharge opening in the other housing to be drained. Depressions 31 are formed in order to save weight.

If water of condensation is formed in the interior of the housing, this water of condensation runs in the direction of an arrow P to the lowest point, namely into the bend 19 in the U-shaped section 14. The water runs so far that the sphere 27 which normally rests on the lowest section of the enlargement 18 due to gravity, floats up; the greater the amount of water which runs into the canal, the higher the water level rises therein and specifically to the point where the water level reaches the upper edge of the discharge canal 20; if this occurs, the water can flow out of the discharge canal 20 into the blind hole 21 along the direction of an arrow P1. If, on the other hand, water or dust or similar material were to penetrate through the blind hole 21, then the hollow sphere 27 would be pushed against the lower section of the enlargement 18 so that the enlargement would be sealed off in that section and a backflow against the direction P would not be possible. Needless to say, the drainage housing 11 is basically disposed at the lowest point of the housing containing the electric components.

Figure 5:
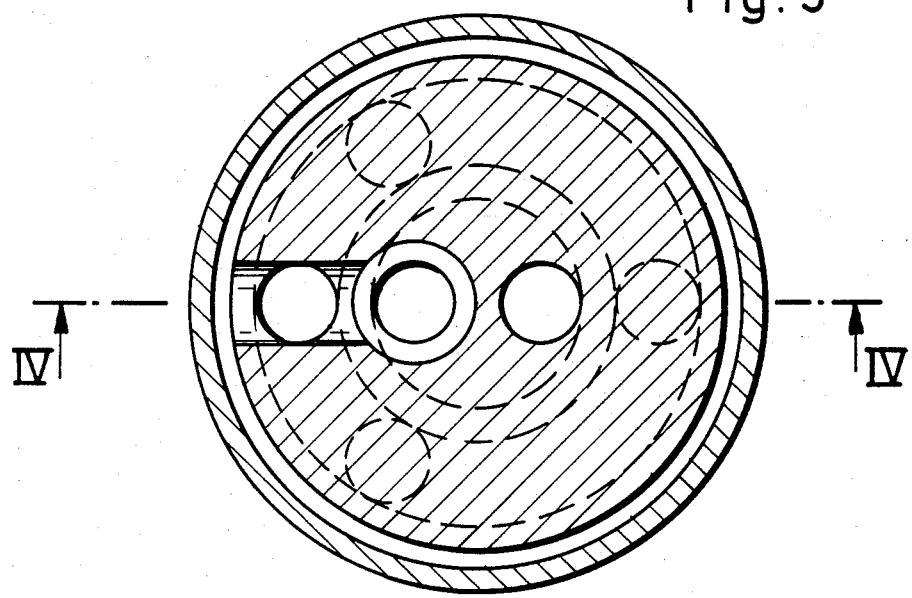
FIG. 5 is a cross-sectional view taken along the section line V—V of FIG. 4, in the direction of the arrows.

FIGS. 4 and 5 show a different embodiment of the invention. A canal housing 41 shown in these figures includes a first housing part 42 which has a circular cylindrical cross section. The first housing part 42 is pierced by a first hole 43, which will also be referred to as a through hole, and a second hole 44 parallel to the first hole which has an enlarged section 45 that is narrowed downward into a region 46. The second hole 44 is closed toward the top, i.e. on the side facing a housing 47 to be drained, by means of a plug 48. A transverse hole 49 opens into the enlargement 45 followed by a discharge hole or discharge canal 50. The canal housing 41 also has a second housing part 51 which is cup-shaped; a cup bottom 52 of the part 51 and specifically the inside thereof, has a circular depression 53 into which the narrowed part 46 and the hole 43 open. This circular depression which forms a connecting canal is surrounded by a narrow ring 54, into which the discharge canal 50 opens. Several drainage through holes 55, preferably three, which are uniformly distributed over the circumference of the housing, lead into a canal ring 54.

In the interior of the enlargement 45 is a sphere 56 which again serves as a check valve for the egress of water. A rim or collar 57 of the second housing part 51 covers the transverse hole 49 and seals the hole from the outside. The two housing parts are connected to each other by means of a screw connection 58. If condensate water flows out of the housing 47 to be drained, it flows according to the direction of the arrow P, into the through hole 43 and thus arrives at the narrowed region 46 and the enlargement 45, causing the sphere 56 to float up. The water level rises in the hole 44 until the lower edge of the transvere hole 49 is reached; thereupon, the water can flow out and off in the direction of the arrow P1 through the holes 55.

The housing 41 is fastened by means of a screw connection. To this end, the housing 41 has a threaded section 59, by means of which the housing 41 can be screwed into the discharge opening in the housing 47 shown in FIG. 5.

The embodiment according to FIGS. 4 and 5 is an improvement over the embodiment according to FIGS. 1 to 3 inasmuch as in the embodiment according to FIGS. 1 to 3, freezing of the water in the bend 19 can lead to damage or destruction of the housing. In the embodiment according to FIGS. 4 and 5, these drawbacks are substantially avoided. According to FIGS. 4 and 5, the bottom 52 of the second housing part 51 is merely deflected downward. Damage and destruction are not caused by this occurrence.

I claim:

1. Drainage canal assembly to be connected to a housing for receiving electrical components for draining liquid from the housing for receiving electrical components, the assembly comprising a canal housing formed of first and second interconnected housing parts and having a first surface facing toward and a second surface facing away from a discharge opening in the housing to be drained, a drainage canal in the form of a syphon formed in said canal housing including first and second mutually spaced apart through holes formed in said first housing part, said first through hole having an opening for communication with the discharge opening, said second through hole being closed toward the housing to be drained, a check valve being disposed in said second through hole of said drainage canal permitting liquid to leave the canal housing but preventing liquid and dust from entering, a discharge canal being formed in said first housing part, being connected to said second through hole and being open toward said second surface, and a connecting canal formed in said second housing part and interconnecting said two through holes at ends thereof facing toward said second surface forming a U-shaped bend of said drainage canal, said second housing part including a canal ring liquid-tightly separated from said connecting canal and communicating with said discharge canal, and said second housing part including drainage holes leading from said canal ring to the surroundings.

2. Drainage canal assembly according to claim 1, including means for fastening said canal housing to a discharge opening in the housing to be drained.

3. Drainage canal assembly according to claim 1, wherein said connecting canal is a circular depression and said canal ring is a circular ring concentrically surrounding said circular depression.

4. Drainage canal assembly according to claim 1, wherein said check valve includes a hollow sphere.

5. Drainage canal assembly to be connected to a housing for receiving electrical components for draining liquid from the housing for receiving electrical components, the assembly comprising a canal housing formed of first and second interconnected housing parts and having a first surface facing toward and a second surface facing away from a discharge opening in the housing to be drained, a drainage canal in the form of a syphon formed in said canal housing including first and second mutually spaced apart through holes formed in said first housing part, said first through hole having an opening for communication with the discharge opening, said second through hole being closed toward the housing to be drained, a check valve being disposed in said second through hole of said drainage canal permitting liquid to leave the canal housing but preventing liquid and dust from entering, a discharge canal being formed in said first housing part, being connected to said second through hole and being open toward said second surface, and a connecting canal formed in said second housing part and interconnecting said two through holes at ends thereof facing toward said second surface forming a U-shaped bend of said drainage canal, said first housing part including a transverse hole connecting said discharge canal to said second through hole, and said second housing part including a collar covering said transverse hole.

6. Drainage canal assembly according to claim 5, wherein said housing parts are cylindrical and are screwed together.

7. Drainage canal assembly according to claim 5, including means for fastening said canal housing to a discharge opening in the housing to be drained.

8. Drawing canal assembly according to claim 5, wherein said check valve includes a hollow sphere.

* * * * *